(12) United States Patent
Sim et al.

(10) Patent No.: US 12,387,911 B2
(45) Date of Patent: Aug. 12, 2025

(54) SUPPORT UNIT, APPARATUS FOR TREATING SUBSTRATE, AND METHOD FOR TREATING SUBSTRATE

(71) Applicant: PSK INC., Gyeonggi-do (KR)

(72) Inventors: Ho Jae Sim, Gyeonggi-do (KR); Hyeong Shin Cho, Gyeonggi-do (KR)

(73) Assignee: PSK INC., Gyeonggi-do (KR)

( * ) Notice: Subject to any disclaimer, the term of this patent is extended or adjusted under 35 U.S.C. 154(b) by 493 days.

(21) Appl. No.: 17/510,617

(22) Filed: Oct. 26, 2021

(65) Prior Publication Data

US 2022/0181122 A1  Jun. 9, 2022

(30) Foreign Application Priority Data

Dec. 3, 2020 (KR) .................. 10-2020-0167767

(51) Int. Cl.
*H01J 37/32* (2006.01)
*H01J 37/20* (2006.01)
*H01L 21/311* (2006.01)
*H01L 21/687* (2006.01)

(52) U.S. Cl.
CPC ........ *H01J 37/32385* (2013.01); *H01J 37/20* (2013.01); *H01L 21/31116* (2013.01); *H01L 21/68742* (2013.01)

(58) Field of Classification Search
USPC .......................................... 156/915; 118/729
See application file for complete search history.

(56) References Cited

U.S. PATENT DOCUMENTS

| | | | |
|---|---|---|---|
| 6,013,984 A | 1/2000 | Ellinger | |
| 2006/0214548 A1* | 9/2006 | Lam | A47B 88/427 312/332 |
| 2008/0190367 A1 | 8/2008 | Lee | |
| 2017/0221720 A1* | 8/2017 | Cho | H01J 37/321 |
| 2018/0308737 A1* | 10/2018 | Moriya | H01L 21/6831 |

(Continued)

FOREIGN PATENT DOCUMENTS

| | | |
|---|---|---|
| JP | 2002-517913 A | 6/2002 |
| JP | 2004260159 A | 9/2004 |
| JP | 2020-532852 A | 11/2020 |

(Continued)

OTHER PUBLICATIONS

Search Report & Written Opinion issued by the Intellectual Property Office of Singapore on Feb. 13, 2023 in corresponding Singapore Patent Application No. 10202111285Q, English Translation.

(Continued)

*Primary Examiner* — Ram N Kackar
(74) *Attorney, Agent, or Firm* — Carter, DeLuca & Farrell LLP

(57) ABSTRACT

The present invention provides a support unit included in an apparatus for treating a substrate by using plasma. The support unit may include: a chuck configured to support a lower surface of the substrate; a moving plate provided to surround the chuck when viewed from above; and a lifting member configured to change an exposed area of an edge region of the substrate supported by the chuck for the treating space by relatively moving the moving plate in an upper or lower direction with respect to the chuck.

7 Claims, 8 Drawing Sheets

(56) References Cited

U.S. PATENT DOCUMENTS

2020/0312633 A1    10/2020  Rathnasinghe

FOREIGN PATENT DOCUMENTS

| | | |
|---|---|---|
| KR | 1020050105559 A | 11/2005 |
| KR | 10-0626905 B1 | 9/2006 |
| KR | 10-2008-0001163 A | 1/2008 |
| KR | 10-2008-0023569 A | 3/2008 |
| KR | 10-2010-0043844 A | 4/2010 |
| KR | 10-2011-0080811 A | 7/2011 |
| KR | 10-1677662 B1 | 11/2016 |
| WO | 99/64644 A1 | 12/1999 |

OTHER PUBLICATIONS

Notice of Reasons for Refusal issued by the Japanese Patent Office on Mar. 6, 2023 in corresponding JP Patent Application No. 2021-170009, with English translation.

* cited by examiner

SUPPORT UNIT, APPARATUS FOR TREATING SUBSTRATE, AND METHOD FOR TREATING SUBSTRATE

CROSS-REFERENCE TO RELATED APPLICATIONS

This application claims priority to and the benefit of Korean Patent Application No. 10-2020-0167767 filed in the Korean Intellectual Property Office on Dec. 3, 2020, the entire contents of which are incorporated herein by reference.

TECHNICAL FIELD

The exemplary embodiments of the inventive concept disclosed herein relate to a support unit, and a substrate treating apparatus for treating a substrate and a substrate treating method using the support unit.

BACKGROUND ART

Plasma refers to an ionized gas state formed of ions, radicals, electrons, and the like, and is generated by a very high temperature, strong electric fields, or RF electromagnetic fields. A semiconductor device manufacturing process includes an ashing, etching, or strip process for removing a hard mark in order to remove a membrane on a substrate, such as a wafer, by using plasma. The ashing, etching, or strip process is performed when ions and radical particles contained in the plasma collide or react with the membrane on the substrate.

Recently, as the degree of integration of the semiconductor increases, the number of chips that can be manufactured from one substrate (for example, a wafer) increases. Accordingly, in order to maximize the number of chips that can be manufactured from one substrate, an edge treating process which is capable of effectively treating an edge portion of the substrate is attracting attention. In order to increase the number of chips that can be manufactured from one substrate, the precise treating for the edge portion of the substrate is required.

However, when a deposition process, such as Chemical Vapor Deposition (CVD), progresses, an edge portion of a rear surface of the substrate is exposed to reactive gas, so that there is a problem in that a thin film is formed. The thin film becomes a problem in a subsequent process and causes a problem in the production of the foregoing chip.

For example, FIG. 1 illustrates a general susceptor 1000 provided in an apparatus for treating a substrate by using plasma. The general susceptor 1000 provided in the apparatus for treating a substrate by using plasma includes a support plate 1100, a support shaft 1200, and lift pins 1300. The support plate 1100 has a seating surface on which the substrate W is placed, and the support shaft 1200 supports the support plate 1100. Further, the lift pin 1300 loads and unloads a substrate W to or from the support plate 1100 by moving the substrate W in up and down directions.

An upper surface of the support plate 1100 has a stepped shape so that a height of the center region of the upper surface is lower than a height of the edge region. Accordingly, the substrate W placed on the support plate 1100 may be prevented from sliding in a lateral direction.

Since a rear surface of the substrate W placed on the susceptor 1000 is not exposed to the outside in hardware, it is almost impossible for plasma to flow into the lower surface of the substrate W. That is, only the upper surface of the substrate W placed on the susceptor 1000 is exposed to the plasma, so that a thin film attached to the lower surface of the substrate W cannot be removed. Further, a method may be considered in which the lift pin 1300 lifts the substrate W so that the plasma is introduced into the lower surface of the substrate W, but since the position of the support plate 1100 is physically limited, the process control is limited. Further, in order to remove the thin film attached to the edge of the rear surface of the substrate W, a method in which the substrate W is transferred to a separate substrate treating apparatus that performs a process of removing the thin film attached to the edge of the rear surface of the substrate W may be considered, but the foregoing substrate W treating method consumes additional time for transferring the substrate W, thereby degrading productivity of treating the substrate W.

SUMMARY OF THE INVENTION

The present invention has been made in an effort to provide a support unit and an apparatus for treating a substrate which are capable of efficiently treating a substrate.

The present invention has also been made in an effort to provide a support unit and an apparatus for treating a substrate which are capable of effectively removing a membrane attached to an edge region of a substrate.

The present invention has also been made in an effort to provide a support unit and an apparatus for treating a substrate which are capable of effectively removing a membrane attached to a lower surface of an edge region of a substrate.

The present invention has also been made in an effort to provide a support unit and an apparatus for treating a substrate which are capable of removing all of membranes attached to an upper surface of a substrate and a lower surface of an edge region of the substrate in one substrate treating apparatus.

The problem to be solved by the present invention is not limited to the above-mentioned problems, and the problems not mentioned will be clearly understood by those skilled in the art from the present specification and the accompanying drawings.

An exemplary embodiment of the present invention provides an apparatus for treating a substrate. The apparatus includes: a chamber having a treating space; a support unit configured to support a substrate in the treating space; and a power supply unit configured to generate an electric field in the treating space and generate plasma from process gas or a treatment fluid supplied to the treating space, in which the support unit may include: a chuck configured to support a lower surface of the substrate; a moving plate provided to surround the chuck when viewed from above; and a lifting member configured to change an exposed area of an edge region of the substrate supported by the chuck for the treating space by relatively moving the moving plate in an upper or lower direction with respect to the chuck.

According to the exemplary embodiment, when viewed from above, a diameter of the chuck may be smaller than a diameter of the substrate placed on the chuck.

According to the exemplary embodiment, the moving plate may have a ring shape when viewed from above, and have a stepped shape in which a height of an inner upper surface is lower than a height of an outer upper surface.

According to the exemplary embodiment, the edge region of the substrate placed on the support unit may overlap the inner upper surface of the moving plate when viewed from above.

According to the exemplary embodiment, a guide part to which a guide member provided to the moving plate is inserted and which guides a vertical movement of the moving plate may be formed on a lateral surface of the chuck.

According to the exemplary embodiment, the guide member may have a shape in which back portions of one pair of guide components shaped like "¬" face each other.

According to the exemplary embodiment, the apparatus may further include a control unit, in which the control unit may control the lifting member so as to move the moving plate in the lower direction, in order to improve efficiency of a treatment of the lower surface of the edge region of the substrate supported by the support unit.

According to the exemplary embodiment, the lifting member may include: a first lifting member which moves the chuck in the vertical direction; and a second lifting member which moves the moving in the vertical direction.

According to the exemplary embodiment, the control unit may decrease a gap between the substrate and a baffle disposed on an upper portion of the chuck by moving the chuck and the moving plate in the upper direction after the substrate is placed on the chuck, and control the first lifting member and the second lifting member so as to move the moving plate in the lower direction in order to remove a membrane attached to the lower surface of the edge region of the substrate and a lateral surface of the substrate caused due to inflow of the plasma to the lower surface of the edge region of the substrate.

Another exemplary embodiment of the present invention provides a support unit included in an apparatus for treating a substrate by using plasma. The support unit may include: a chuck configured to support a lower surface of the substrate; a moving plate provided to surround the chuck when viewed from above; and a lifting member configured to change an exposed area of an edge region of the substrate supported by the chuck for the treating space by relatively moving the moving plate in an upper or lower direction with respect to the chuck.

According to the exemplary embodiment, when viewed from above, a diameter of the chuck may be smaller than a diameter of the substrate placed on the chuck.

According to the exemplary embodiment, the moving plate may have a ring shape when viewed from above, and have a stepped shape in which a height of an inner upper surface is lower than a height of an outer upper surface so as to prevent the substrate placed on the chuck from sliding.

According to the exemplary embodiment, the inner upper surface may overlap the edge region of the substrate when viewed from above.

According to the exemplary embodiment, a guide part to which a guide member provided to the moving plate is inserted and which guides a vertical movement of the moving plate may be formed on a lateral surface of the chuck.

According to the exemplary embodiment, the guide member may have a shape in which back portions of one pair of guide components shaped like "¬" face each other.

In addition, the present invention provides a method of treating a substrate. According to the exemplary embodiment, the method comprises supporting a bottom face of a substrate with a chuck in a treatment space, and generating plasma from process gas or treatment fluid introduced into the treatment space by applying an electric field in the treatment space to treat the substrate, and wherein a spacing between a top face of a moving plate surrounding the chuck and a bottom face of an edge area of the substrate are controlled by moving the moving plate in a vertical direction.

According to the exemplary embodiment, after removing a film from the top face of the substrate with the plasma, the moving plate may be moved downwardly to space apart the bottom face of the substrate and the top face of the moving plate from each other, thereby removing a film from the bottom surface of an edge area of the substrate with the plasma.

According to the exemplary embodiment, the top face of the moving plate may have an inner top face and an outer top face, the inner top face may be lower than the outer top face, and the spacing may be a spacing between the bottom face of the substrate and the inner top face of the moving plate.

According to the exemplary embodiment, the inner top face may overlap with the edge area of the substrate when viewed from above.

According to the exemplary embodiment, the film on the top face of the substrate may be a hard mask.

According to the exemplary embodiment of the present invention, it is possible to efficiently treat a substrate.

Further, according to the exemplary embodiment of the present invention, it is possible to effectively remove a membrane attached to an edge region of a substrate.

Further, according to the exemplary embodiment of the present invention, it is possible to effectively remove a membrane attached to a lower surface of an edge region of a substrate.

Further, according to the exemplary embodiment of the present invention, it is possible to remove all of the membranes attached to an upper surface of a substrate and a lower surface of an edge region of the substrate in one substrate treating apparatus.

The effect of the present invention is not limited to the foregoing effects, and the not-mentioned effects will be clearly understood by those skilled in the art from the present specification and the accompanying drawings.

DETAILED DESCRIPTION

Figure 1:
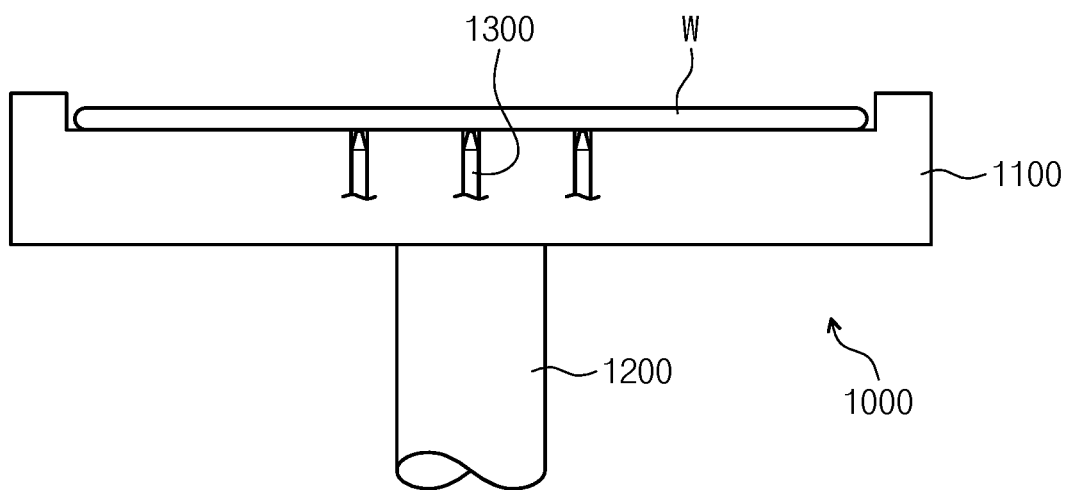
FIG. 1 is a diagram illustrating a general susceptor provided in an apparatus for treating a substrate by using plasma.

Hereinafter, an exemplary embodiment of the present invention will be described more fully hereinafter with reference to the accompanying drawings, in which exemplary embodiments of the invention are shown. However, the present invention can be variously implemented and is not limited to the following embodiments. In the following description of the present invention, a detailed description of known functions and configurations incorporated herein is omitted to avoid making the subject matter of the present invention unclear. In addition, the same reference numerals are used throughout the drawings for parts having similar functions and actions.

Unless explicitly described to the contrary, the word "comprise" and variations such as "comprises" or "comprising", will be understood to imply the inclusion of stated elements but not the exclusion of any other elements. It will be appreciated that terms "including" and "having" are intended to designate the existence of characteristics, numbers, steps, operations, constituent elements, and components described in the specification or a combination thereof, and do not exclude a possibility of the existence or addition of one or more other characteristics, numbers, steps, operations, constituent elements, and components, or a combination thereof in advance.

Singular expressions used herein include plurals expressions unless they have definitely opposite meanings in the context. Accordingly, shapes, sizes, and the like of the elements in the drawing may be exaggerated for clearer description.

Terms, such as first and second, are used for describing various constituent elements, but the constituent elements are not limited by the terms. The terms are used only to discriminate one constituent element from another constituent element. For example, without departing from the scope of the invention, a first constituent element may be named as a second constituent element, and similarly a second constituent element may be named as a first constituent element.

It should be understood that when one constituent element referred to as being "coupled to" or "connected to" another constituent element, one constituent element can be directly coupled to or connected to the other constituent element, but intervening elements may also be present. In contrast, when one constituent element is "directly coupled to" or "directly connected to" another constituent element, it should be understood that there are no intervening element present. Other expressions describing the relationship between the constituent elements, such as "between" and "just between" or "adjacent to ~", and "directly adjacent to ~" should be interpreted similarly.

All terms used herein including technical or scientific terms have the same meanings as meanings which are generally understood by those skilled in the art unless they are differently defined. Terms defined in generally used dictionary shall be construed that they have meanings matching those in the context of a related art, and shall not be construed in ideal or excessively formal meanings unless they are clearly defined in the present application.

Hereinafter, an exemplary embodiment of the present invention will be described in detail with reference to FIGS. 2 to 8.

First, a substrate W treated by a substrate treating apparatus 10 according to an exemplary embodiment of the present invention may be a silicon wafer. Further, a hardmask may be formed on the substrate W treated by the substrate treating apparatus 10 according to the exemplary embodiment of the present invention. For example, the substrate treating apparatus 10 may perform a hardmask strip process that removes the hardmask formed on the substrate W. Further, the substrate W loaded into the substrate treating apparatus 10 may be the substrate W on which a deposition process, such as Chemical Vapor Deposition (CVD), has been performed.

Figure 2:
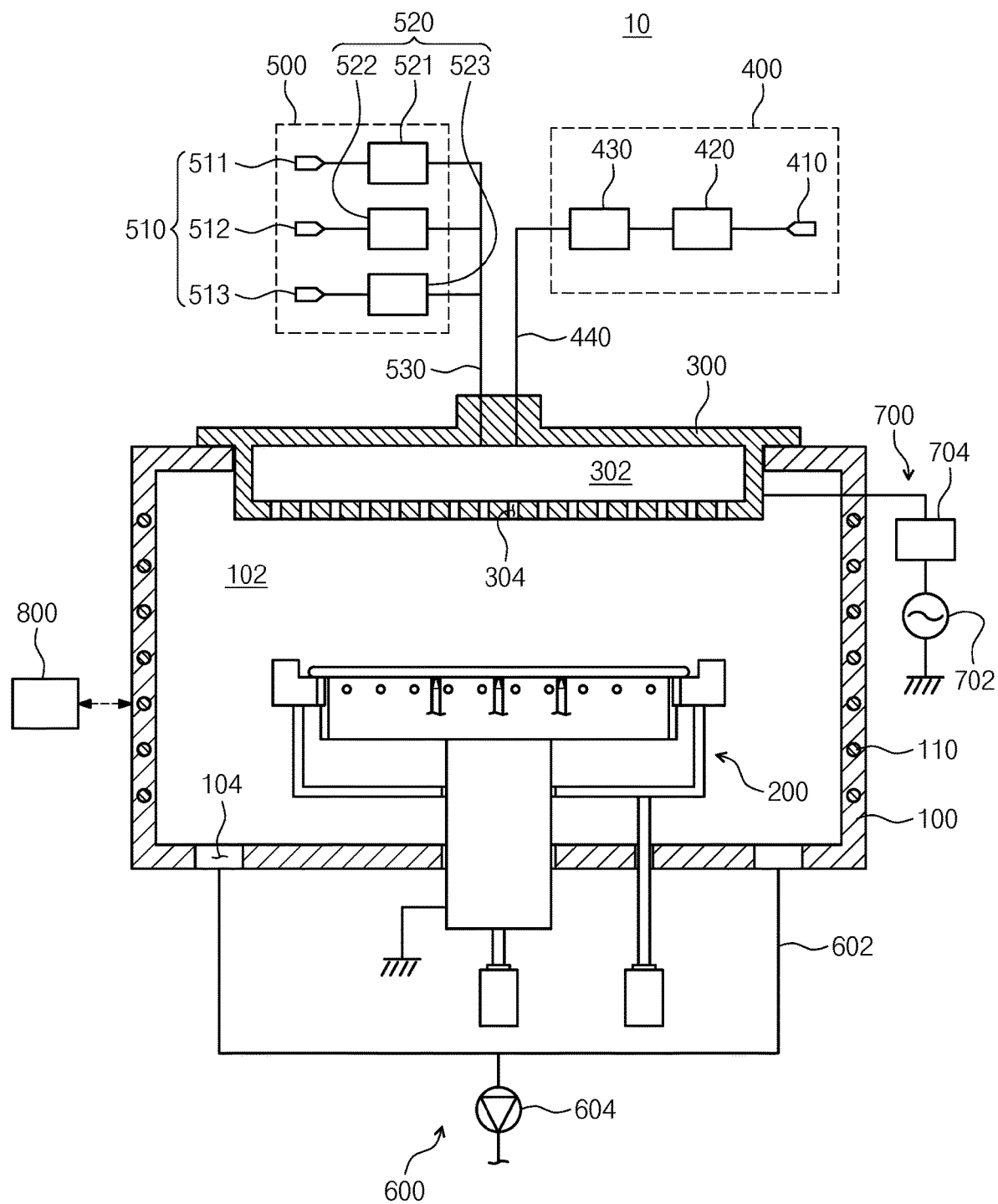
FIG. 2 is a diagram illustrating a substrate treating apparatus according to an exemplary embodiment of the present invention.

FIG. 2 is a diagram illustrating the substrate treating apparatus according to the exemplary embodiment of the present invention. Referring to FIG. 2, the substrate treating apparatus 10 according to the exemplary embodiment of the present invention may include a chamber 100, a support unit 200, a baffle 300, a fluid supply unit 400, a gas supply unit 500, an exhaust unit 600, a power supply unit 700, and a control unit 800.

The chamber 100 may have a treating space 102. The chamber 100 may be grounded. The treating space 102 provided in the chamber 100 may be the space in which a thin film removal process of removing a hardmask formed on the substrate W is removed. An inlet (not illustrated) through which the substrate W is loaded into the treating space 102 or the substrate W is unloaded from the treating space 102 may be formed at one side of the chamber 100. The inlet may be selectively opened/closed by a door (not illustrated). Further, an exhaust hole 104 which is connected with the exhaust unit 600, which is to be described below, may be formed in a lower surface of the chamber 100.

Further, a cooling member 110 may be provided to the chamber 100. The cooling member 110 may adjust a temperature of the chamber 100. The cooling member 110 may adjust a temperature of the treating space 102. The cooling member 110 may be a flow path connected with a cooling fluid supply source that supplies a cooling fluid. The cooling fluid supplied to the cooling member 110 may be cooling water or cooling gas. However, the present invention is not limited thereto, and the cooling member 110 may be variously modified into a publicly known member capable of transferring cooling heat to the chamber 100.

The support unit 200 may support the substrate W in the treating space 102. The support unit 200 may support the substrate W while the hardmask formed on the substrate W is removed by plasma P. The support unit 200 may adjust a temperature of the supported substrate W. For example, the support unit 200 may further increase treatment efficiency (for example, a strip rate) by the plasma P by heating the supported substrate W. Further, the support unit 200 may move the substrate W in a vertical direction. For example, the support unit 200 may adjust a gap between an upper surface of the substrate W and the baffle 300 which is to be described below by moving the substrate W in an upper direction or a lower direction. Further, the support unit 200 may be grounded. The support unit 200 will be described in detail below.

The baffle 300 may supply process gas and/or a treatment fluid to the treating space 102. The baffle 300 may be provided in a cylindrical shape having an inner space 302. Further, an injection hole 304, in which process gas and/or a treatment fluid flows, may be formed in a lower surface of the baffle 300. An injection port to which a fluid supply line 440 and a gas supply line 530, which will be described below, are connected may be formed on the upper portion of the baffle 300. The treatment fluid supplied by the fluid supply line 440 and the process gas supplied by the gas supply line 530 may flow into the inner space 302 through the injection port. The process gas and/or treatment fluid flowing into the inner space 302 may flow into the treating space 102 through the injection hole 302. Further, the lower surface of the baffle 300 may have a stepped shape in which the lower surface of the edge region is lower than the lower surface of the central region. Therefore, the baffle 300 may be inserted into an opening formed in the upper portion of the chamber 100 and installed. Further, the baffle 300 may be grounded.

The fluid supply unit 400 may supply the treatment fluid to the treating space 102. The treatment fluid supplied by the fluid supply unit 400 may include water ($H_2O$), alcohol, and the like. Alcohol may be methanol (MeOH, an example of first alcohol) or ethanol (EtOH, an example of second alcohol), Further, the fluid supply unit 400 may include a treatment fluid supply source 410, a vaporizer 420, a flow rate adjusting member 430, and the fluid supply line 440.

The treatment fluid supply source 410 may deliver the treatment fluid including water ($H_2O$) to the vaporizer 420. Further, the treatment fluid supply source 410 may deliver the liquid treatment fluid to the vaporizer 420. The vaporizer 420 may change the treatment fluid to a vaporized state by a method of heating the received treatment fluid at a high temperature and the like. The high-temperature treatment fluid changed to the vaporized state in the vaporizer 420 may be delivered to the baffle 300 through the fluid supply line 440 connected with the baffle 300. Further, the treatment fluid delivered to the baffle 300 may be injected to the treating space 102 through the injection hole 304. Further, the flow rate adjusting member 430 may change a supply flow rate per unit time of the treatment fluid delivered to the baffle 300. The flow rate adjusting member 430 may be a regulator or a flow rate adjustment valve. However, the present invention is not limited thereto, and the flow rate adjusting member 430 may be variously modified to the publicly known device which is capable of changing a supply flow rate per unit time of the treatment fluid.

The gas supply unit 500 may supply process gas to the treating space 102. The process gas supplied to the treating space 102 by the gas supply unit 500 may include at least one of more of $N_2$, Ar, $H_2$, $O_2$, and $O^*$ The gas supply unit 500 may include a gas supply source 510, a flow rate control member 520, and a gas supply line 530.

The gas supply source 510 may supply process gas to the baffle 300 through the gas supply line 530. The process gas supplied to the baffle 300 may be supplied to the treating space 102 through the injection hole 304. The gas supply source 510 may include a first gas supply source 511, a second gas supply source 512, and a third gas supply source 513. The first gas supply source 511 may supply nitrogen ($N_2$) gas. The second gas supply source 512 may supply argon (Ar) gas. The third gas supply source 513 may supply hydrogen ($H_2$) gas. Further, a supply flow rate per unit time of the process gas supplied by the gas supply source 510 may be adjusted by the flow rate control member 520. For example, the flow rate control member 520 may include a first flow rate control member 521, a second flow rate control member 522, and a third flow rate control member 523. Further, a supply flow rate per unit time of the process gas supplied by the first gas supply source 511 may be adjusted by the first flow rate control member 521 installed in the gas supply line 530. Further, a supply flow rate per unit time of the process gas supplied by the second gas supply source 512 may be adjusted by the second flow rate control member 522 installed in the gas supply line 530. Further, a supply flow rate per unit time of the process gas supplied by the third gas supply source 513 may be adjusted by the third flow rate control member 523 installed in the gas supply line 530. The flow rate control member 520 may be a regulator or a flow rate adjusting valve. However, the present invention is not limited thereto, and the flow rate control member 520 may be variously modified to the publicly known device that adjusts a supply flow rate per unit time of the process gas.

The exhaust unit 600 may exhaust the treating space 102. The exhaust unit 600 may exhaust the treating space 102 at least one or more of before the substrate W is treated, after the substrate W is treated, and while the substrate W is treated. The exhaust unit 600 may exhaust the treating space 102 to discharge the process gas and the treatment fluid supplied to the treating space 102, and by-products (or impurities) that may be generated in the process of treating the substrate W to the outside of the treating space 102. The exhaust unit 600 may include an exhaust line 602 connected with the exhaust hole 104, and an exhaust member 604 providing the exhaust line 602 with reduced pressure. The exhaust member 604 may be a pump. However, the present invention is not limited thereto, and the exhaust member 604 may be variously modified to the publicly known device that provides the treating space 102 with reduced pressure and exhausts the treating space 102.

The power supply unit 700 may generate an electric field in the treating space 102. The power supply unit 700 may generate an electric field in the treating space 102 to generate plasma from the process gas or the treatment fluid supplied to the treating space 102. The power supply unit 700 may include a high-frequency power supply 702 and a matching unit 704. The high-frequency power supply 702 may be an RF power supply. The matching unit 704 may perform matching on the high-frequency power supply 702.

The control unit 800 may control the substrate treating apparatus 10. The control unit 800 may control the substrate treating apparatus 10 so as for the substrate treating apparatus 10 to perform a thin film removal process (for example, a hardmask strip process) of removing a thin film on the substrate W. Further, the control unit 800 may include a process controller formed of a microprocessor (computer) that executes the control of the substrate treating apparatus 10, a user interface formed of a keyboard in which an operator performs a command input operation or the like in order to manage the substrate treating apparatus 10, a display for visualizing and displaying an operation situation of the substrate treating apparatus 10, and the like, and a storage unit storing a control program for executing the process executed in the substrate treating apparatus 10 under the control of the process controller or a program, that is, a treatment recipe, for executing the process in each component according to various data and treating conditions. Further, the user interface and the storage unit may be connected to the process controller. The treatment recipe may be stored in a storage medium in the storage unit, and the storage medium may be a hard disk, and may also be a portable disk, such as a CD-ROM or a DVD, or a semiconductor memory, such as a flash memory.

Figure 3:
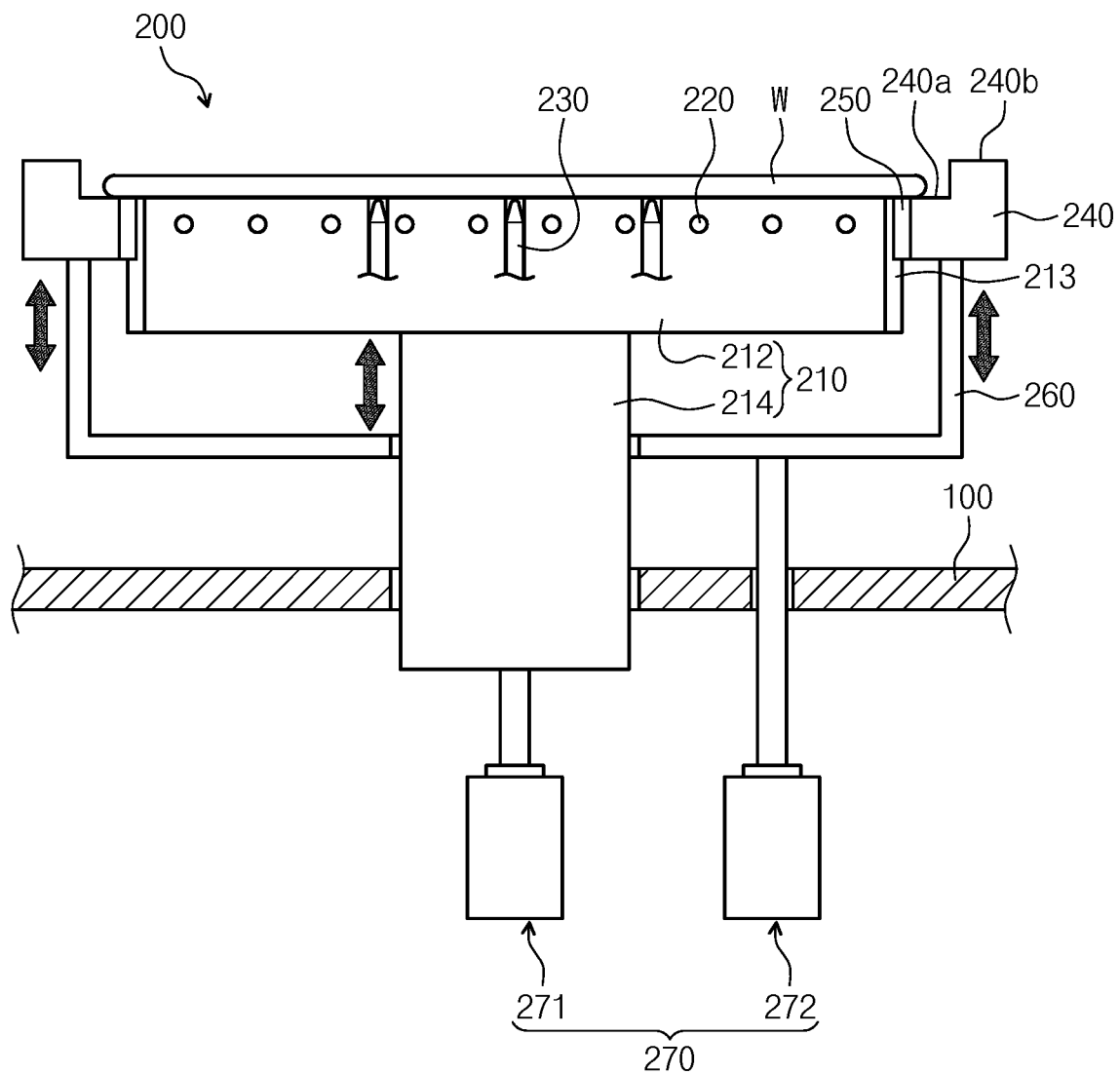
FIG. 3 is a cross-sectional diagram of a support unit of FIG. 2.
Figure 4:
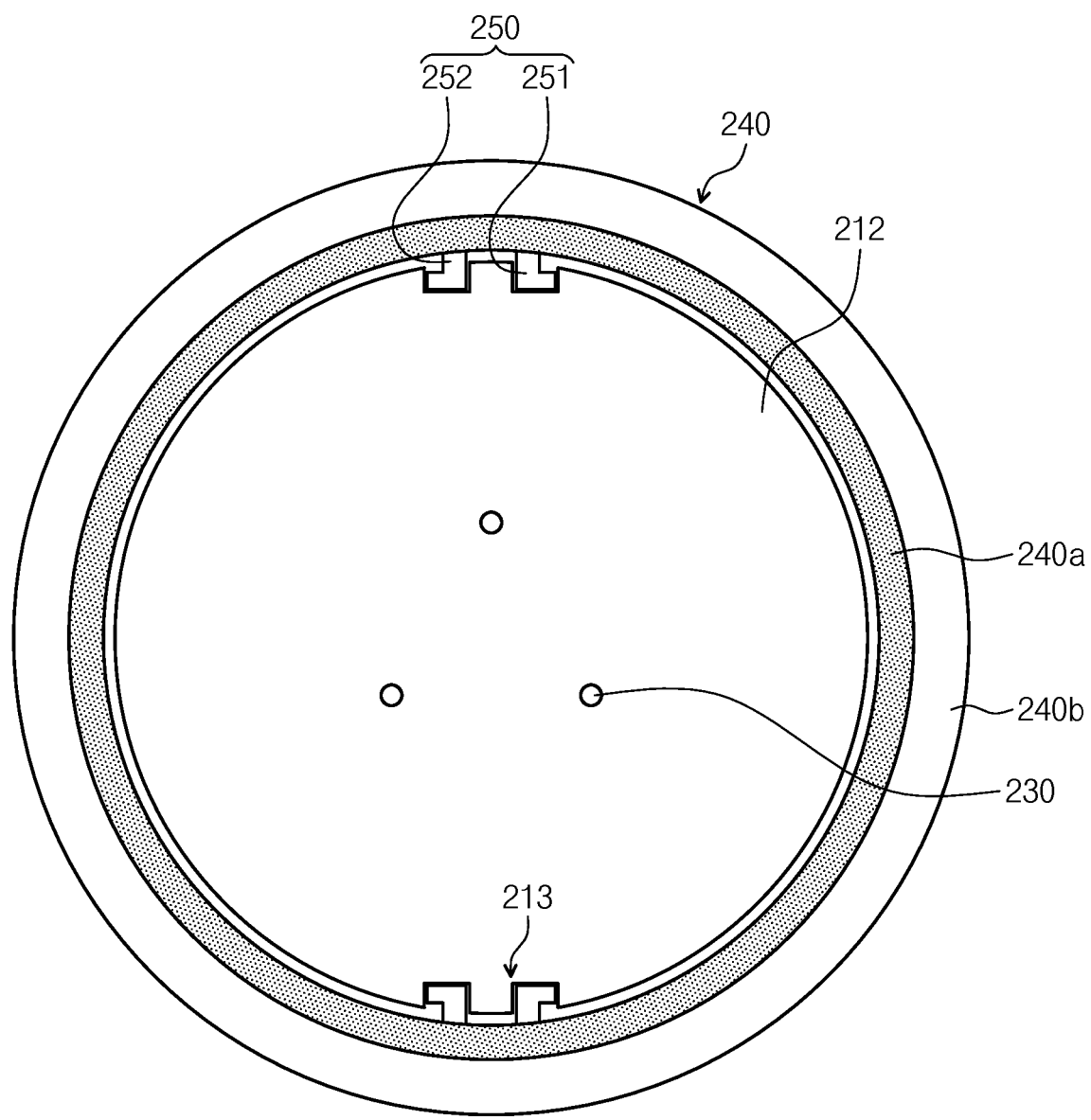
FIG. 4 is a diagram of the support unit of FIG. 2 viewed from above.
Figure 5:
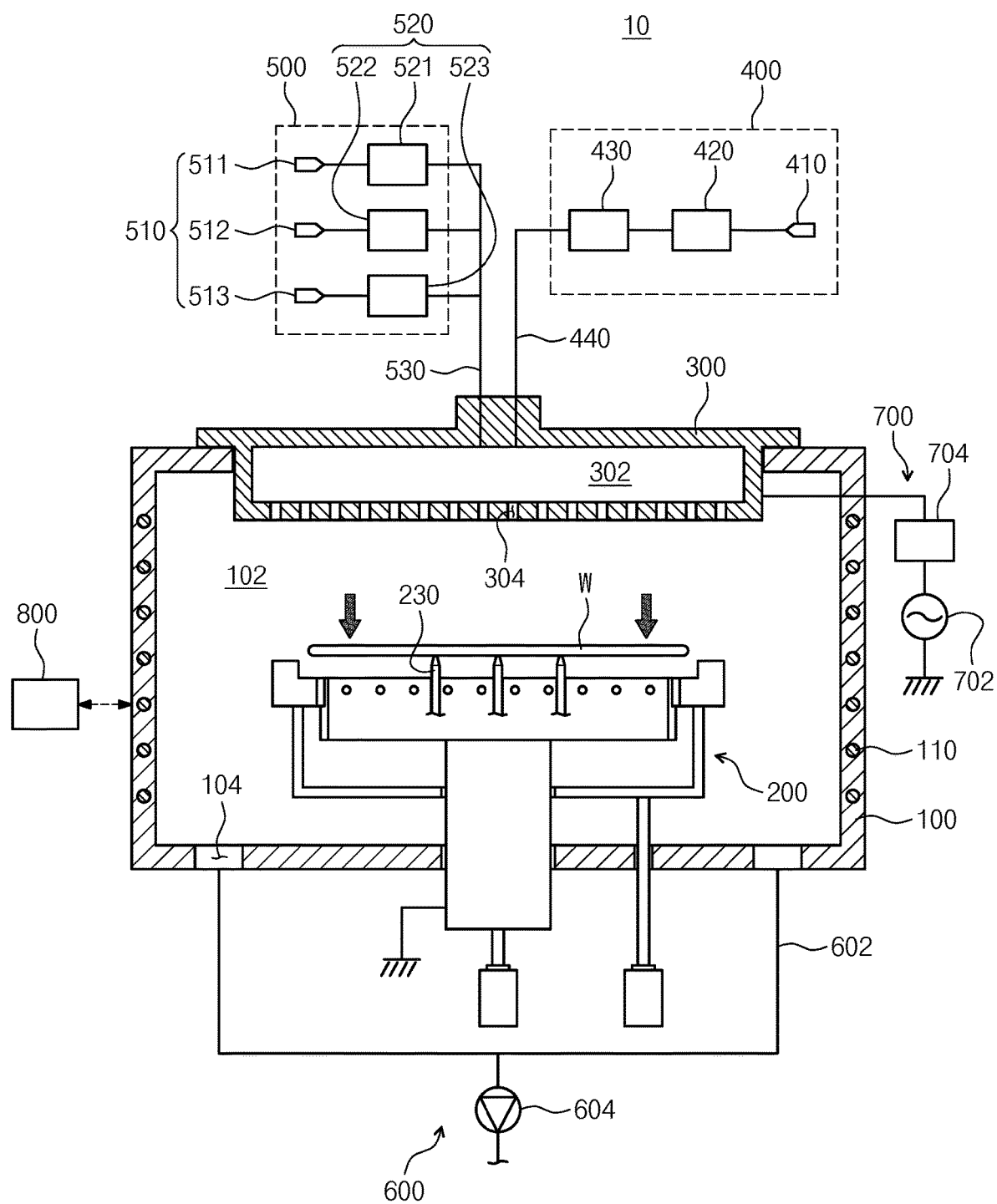
FIG. 5 is a diagram illustrating the state where a substrate is seated on the support unit of FIG. 2.
Figure 6:
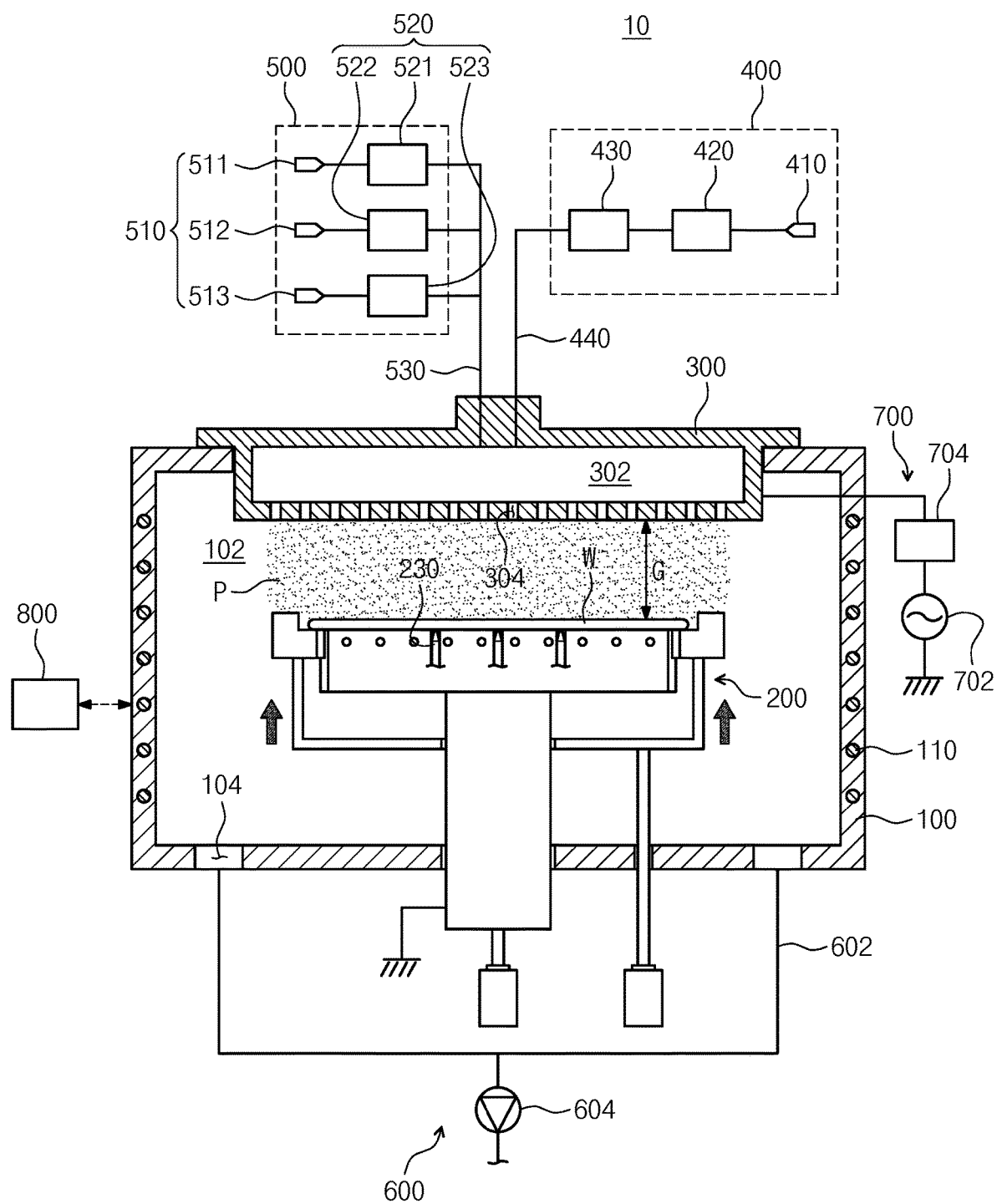
FIG. 6 is a diagram illustrating the case where an upper surface of the substrate supported by the support unit of FIG. 2 is treated by using plasma.

FIG. 3 is a cross-sectional diagram of the support unit of FIG. 2, and FIG. 4 is a diagram of the support unit of FIG. 2 viewed from above. Referring to FIGS. 3 and 4, the support unit 200 according to the exemplary embodiment of the present invention may include a chuck 210, a heating member 220, a lift pin 230, a moving plate 240, a guide member 250, a lifting plate 260, and a lifting member 270.

The substrate W may be placed on an upper portion of the chuck 210. For example, the chuck 210 may have a seating surface on which the substrate W is placed. The chuck 210 may support the lower surface of the substrate W. The chuck 210 may include a support plate 212 and a lifting shaft 214. The support plate 212 may support the lower surface of the substrate W. The lifting shaft 214 may be disposed under the support plate 212 to move the support plate 212 in the vertical direction. For example, the lifting shaft 214 may be moved in the vertical direction by driving force generated by a first lifting member 271 which is to be described below. When the lifting shaft 214 moves in the vertical direction, the support plate 212 may also move in the vertical direction. Further, the support plate 212 may be grounded. For example, an electrode may be provided inside the support plate 212, and the electrode provided in the support plate 212 may be connected with a ground rod provided in the lifting shaft.

Further, when viewed from above, a diameter of the chuck 210 may be smaller than a diameter of the substrate W placed on the chuck 210. For example, the diameter of the support plate 212 may be smaller than the diameter of the substrate W placed on the support plate 212. Accordingly, when the substrate W is placed on the support plate 212, the edge region of the substrate W may protrude to the outside of the support plate 212.

Further, the chuck 210 may be made of a material including metal or ceramic. For example, the support plate 212 may be made of a material including metal or ceramic.

Further, the guide member 250, which is to be described below, is inserted into a lateral surface of the chuck 210, and a guide part 213 which guides a vertical movement of a moving plate 240, which is to be described below, may be formed. The guide part 213 may have a shape corresponding to the guide member 250 which is to be described below. For example, the guide part 213 may include recess parts to which guide components 251 and 252 which are to be described below are inserted, and a protruding part inserted into a space between the guide components 251 and 252.

The chuck 210 may be provided with the heating member 220. For example, the heating member 220 may be provided in the support plate 212 of the chuck 210. The heating member 220 may heat the substrate W supported by the support unit 200. For example, the heating member 220 may transmit cold heat or warm heat to the substrate W supported by the support unit 200 to adjust a temperature of the substrate W. Further, the heating member 220 may be connected with a heating power supply (not illustrated) which applies power to the heating member 220. Further, the heating member 220 may be a heater. However, the present invention is not limited thereto, and the heating member 220 may be variously modified to the publicly known device which is capable of adjusting a temperature of the substrate W.

The lift pin 230 may move the substrate W in the vertical direction. At least one lift pin 230 may be provided. For example, the plurality of lift pins 230 may be provided. The lift pin 230 may move in the vertical direction along a lift pin hole formed in the support plate 212. The lift pin 230 may move in the vertical direction to load the substrate W to the support plate 212 or unload the substrate W from the support plate 212.

The moving plate 240 may be provided so as to surround the chuck 210 when viewed above. The moving plate 240 may be moved in the vertical direction by a second lifting member 272 which is to be described below. The moving plate 240 may have a ring shape. An upper surface of the moving plate 240 may include an inner upper surface 240a and an external upper surface 240b. A height of the inner upper surface 240a may be smaller than a height of the external upper surface 240b. That is, the upper surface of the moving plate 240 may have a stepped shape. Accordingly, when the substrate W is placed on the support plate 212, the moving plate 240 may serve as a sliding barrier that prevents the substrate W from sliding in the lateral direction. Further, the edge region of the substrate W placed on the support unit 200 may overlap the inner upper surface 240a of the moving plate 240 when viewed from above.

Further, the moving plate 240 may be made of the material that is the same as or similar to the material of the chuck 210, for example, the support plate 212. For example, the moving plate 240 may be made of a material including metal or ceramic. Further, the moving plate 240 may also be provided in a material different from that of the chuck 210, for example, the support plate 212. For example, when the support plate 212 is made of the material including a metal, the moving plate 240 may be made of the material including ceramic. Further, when the support plate 212 is made of the material including ceramic, the moving plate 240 may be made of the material including a metal.

When the moving plate 240 moves in the vertical direction, the guide member 250 may guide the vertical movement of the moving plate 240. For example, the guide member 250 is inserted into the guide part 213 of the support plate 212 to guide the vertical movement of the moving plate 240. When viewed from above, the guide member 250 is provided to an inner surface of the moving plate 240. For example, the guide member 250 may be provided to the inner surface of the moving plate 240 corresponding to the lateral surface of the support plate 212. At least one guide member 250 may be provided to the moving plate 240. For example, the plurality of guide members 250 may be provided to the moving plate 240. For example, the two guide members 250 may be provided to the moving plate 240. When the plurality of guide members 250 is provided, the guide members 250 may restrict the degree of freedom to the remaining movement, except for the vertical movement of the moving plate 240, to appropriately guide the vertical movement of the moving plate 240.

The guide member 250 may be configured with one pair of guide components 251 and 252. For example, a first guide component 251 and a second guide component 252 may have a shape of "¬". Further, the back portions of the first guide component 251 and the second guide component 252 may face each other. The first guide component 251 and the second guide component 252 may be spaced apart from each other. The protruding part of the guide part 213 may be inserted into a space between the first guide component 251 and the second guide component 252, and the first guide component 251 and the second guide component 252 may be inserted into the groove portion of the guide part 213.

The lifting plate 260 may move the moving plate 250 in the vertical direction. The lifting plate 260 may be moved in the vertical direction by the second lifting member 272 which is to be described below. The lifting plate 260 may be coupled to a lower surface of the moving plate 240. Therefore, when the second lifting member 272 moves the lifting plate 260 in the vertical direction, the moving plate 250 may be moved in the vertical direction. The lifting plate 260 may have a cylindrical shape of which an upper portion is opened. Further, when viewed from above, an opening, to which the lifting shaft 214 is insertable, may be formed in the center region of the lifting plate 260. Even when one second lifting member 272 that moves the moving plate 240 is provided to the lifting plate 260, it is possible to minimize the moving plate 240 from sagging or being inclined.

The lifting member 270 may move the moving plate 240 in the upper or lower direction relative to the chuck 210. The lifting member 270 may change an exposed area of the edge region of the substrate W supported by the chuck 210 for the treating space 102 by moving the moving plate 240. Further, the lifting member 270 may relatively move the moving plate 240 with respect to the chuck 210 to change a volume of an introduction space to which the plasma P may be introduced to the lower portion of the edge region of the substrate W.

The lifting member 270 may include the first lifting member 271 and the second lifting member 272. The first lifting member 271 may be connected with the lifting shaft 214 of the chuck 210 to move the chuck 210, for example, the support plate 212, in the vertical direction. Further, the second lifting member 272 may be connected with the lifting plate 260 to move the moving plate 240 in the vertical direction. The lifting member 270 may include a motor and a movement shaft coupled to the motor, and the motor included in the lifting member 270 may be disposed outside of the treating space 102.

Hereinafter, a substrate treating method according to an exemplary embodiment of the present invention will be described in detail. In order for the substrate treating apparatus 10 to perform the substrate treating method according to the exemplary embodiment of the present invention, the control unit 800 may control the configurations of the substrate treating apparatus 10. For example, in order for the substrate treating apparatus 10 to perform the substrate treating method which is to be described below, the control unit 800 may control at least one of the first lifting member 271, the second lifting member 272, the gas supply unit 500, the fluid supply unit 400, the power supply unit 700, and the exhaust unit 600 included in the substrate treating apparatus 10.

First, when the substrate W is loaded into the treating space 102, the lift pins 230 of the support unit 200 may move in the upper direction to support the lower surface of the substrate W loaded into the treating space 102. When the substrate W is placed on the lift pins 230, the lift pins 230 may move in the lower direction to seat the substrate W on the upper surface of the support plate 212.

Then, the control unit 800 may control the first lifting member 271 and the second lifting member 272 to move both the chuck 210 and the moving plate 240 in the upper direction. Accordingly, a gap G between the upper surface of the substrate W placed on the support unit 200 and the lower surface of the baffle 300 may be decreased (see FIG. 6). Then, the gas supply unit 500 or the fluid supply unit 400 may supply process gas or a treatment fluid to the treating space 102. The process gas or the treatment fluid may be excited in a plasma P state by an electric field generated by the power supply unit 700. Accordingly, a membrane provided on the upper surface of the substrate W (for example, the hardmask formed on the upper portion of the substrate W) may be removed by the plasma P.

Figure 7:
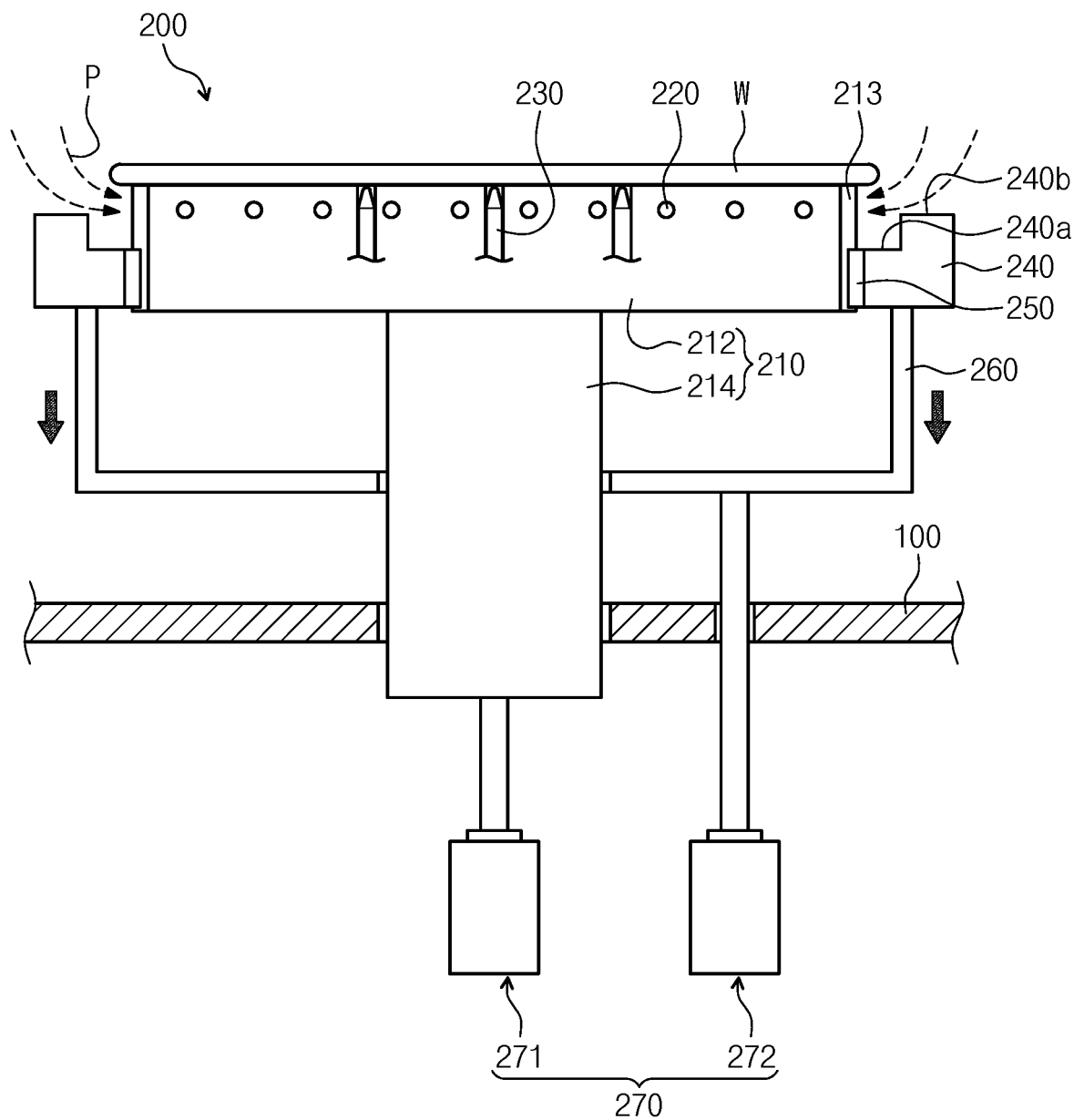
FIG. 7 is a diagram illustrating the case where a lower surface of an edge region of the substrate supported by the support unit of FIG. 2 is treated by using plasma.
Figure 8:
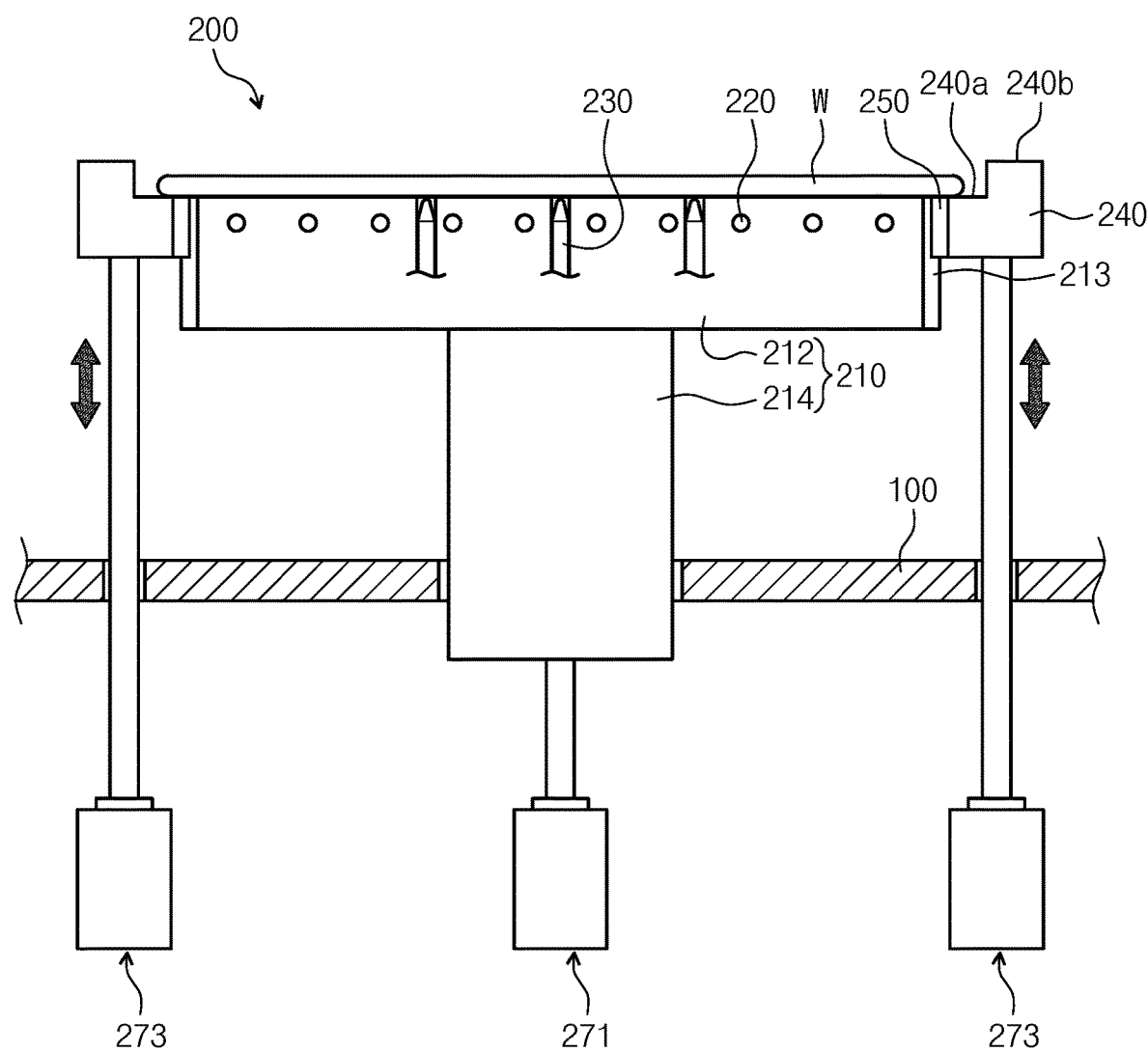
FIG. 8 is a diagram illustrating a support unit according to another exemplary embodiment of the present invention.

After the membrane provided on the upper surface of the substrate W is removed, the second lifting member 272 may move the moving plate 240 in the lower direction (see FIG. 7). When the moving plate 240 is moved in the lower direction, the lower surface of the substrate W and the inner upper surface 240a of the moving plate 240 may be spaced apart from each other. Accordingly, the plasma P may be introduced into the space between the lower surface of the substrate W and the moving plate 240. When the plasma P is introduced into the lower surface of the substrate W, the membrane attached to the lower surface of the edge region of the substrate W and the lateral surface of the substrate W may react with the plasma P and be removed.

In this case, when the moving plate 240, not the chuck 210, is moved in the lower direction, the lower surface of the edge region of the substrate W is exposed to the treating space 102 in the state where the substrate W is supported by the chuck 210. That is, a height of the substrate W is maintained at it is. That is, the gap between the substrate W and the baffle 300 is maintained as it is. When the chuck 210 is moved in the upper direction in order for the lower surface of the edge region of the substrate W is exposed to the treating space 102, another factor affecting the efficiency of the removal of the membrane on the substrate W is changed while the gap between the substrate W and the baffle 300 is changed, and the substrate treating method according to the exemplary embodiment of the present invention may minimize the change of another factor affecting the efficiency of the removal of the membrane on the substrate W by moving the moving plate 240 in the lower direction. However, the present invention is not limited thereto, and the chuck 210 may move in the upper direction and the lower surface of the edge region of the substrate W may be exposed to the treating space 102.

In the general substrate treating apparatus, in terms of hardware, it is almost impossible for the plasma P to flow into the lower surface of the substrate W placed on the susceptor 1000, so that it is very difficult to remove the membrane attached to the lower surface of the edge region of the substrate W. In order to remove the membrane attached to the lower surface of the substrate W, a method of introducing the plasma P into the lower surface of the substrate W by spacing the substrate W apart from the support plate 1100 by using the lift pin 1300 may be considered, but in this case, there is a concern that process by-products generated while the plasma P removes the membrane on the substrate W may be attached to the lower surface of the substrate W and the upper surface of the support plate 1100 again. Further, the gap between the substrate W and the support plate 1100 is limited to the pin-up height of the lift pin 1300, so there is a limit in controlling the removal of the membrane attached to the lower surface of the substrate W.

However, according to the exemplary embodiment of the present invention, only the lower surface of the edge region of the substrate W is exposed to the treating space 102 by moving the moving plate 240 in the vertical direction, thereby effectively removing the membrane attached to the lower surface of the edge region of the substrate W. Further, it is also possible to solve the problem in that the process by-products generated while the substrate W is treated by the plasma P are attached to the lower surface of the substrate W or the upper surface of the support plate 2120.

Further, in the present invention, both the support plate 212 and the moving plate 240 may be moved in the vertical direction. Accordingly, the gap between the lower surface of the substrate W and the upper surface of the moving plate 240 may be determined by the movement range of the moving plate 240, as well as the movement range of the support plate 212. That is, the gap between the lower surface of the edge region of the substrate W and the upper surface of the moving plate 240 may be controlled in the broader range, and it is possible to remove the membrane attached to the lower surface of the edge region of the substrate W in a high selection ratio by appropriately adjusting the gap between the lower surface of the substrate W and the upper surface of the moving plate 240.

In the foregoing example, the case where the moving plate 240 is moved in the vertical direction by the second lifting member 272 via the lifting plate 260 has been described as an example, but the present invention is not limited thereto. For example, the moving plate 240 is directly connected to a third lifting member 273 having the structure that is generally same as or similar to that of the second lifting member 272 to be moved in the vertical direction by the third lifting member 273. Further, the plurality of third lifting members 273 may be provided.

In the foregoing example, the case where the lifting member 270 includes the motor has been described as an example, but the present invention is not limited thereto. For example, the lifting member 270 may be variously modified to the publicly known device (for example, a pneumatic/hydraulic cylinder) that is capable of moving the chuck 210 or the moving plate 240 in the vertical direction.

In the foregoing example, the case where the heating member 220 is provided to the support plate 212 has been described as an example, but the present invention is not limited thereto. For example, the heating member 220 may also be provided to the moving plate 240. Further, the heating member 220 may also be provided to the moving plate 240 and the support plate 212.

The foregoing detailed description illustrates the present invention. Further, the above content shows and describes the exemplary embodiment of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in the specific application field and use of the present invention are possible. Accordingly, the detailed description of the invention above is not intended to limit the invention to the disclosed exemplary embodiment. Further, the accompanying claims should be construed to include other exemplary embodiments as well.

What is claimed is:

1. An apparatus for treating a substrate, the apparatus comprising:
   a chamber having a treating space;
   a support unit configured to support a substrate in the treating space; and
   a power supply unit configured to generate an electric field in the treating space and generate plasma from process gas or a treatment fluid supplied to the treating space,
   wherein the support unit includes:
   a chuck configured to support a lower surface of the substrate;
   a moving plate provided to surround the chuck when viewed from above and configured to move into contact with the substrate;
   a lifting member configured to change an exposed area of an edge region of the substrate supported by the chuck for the treating space by relatively moving the moving plate in an upper or lower direction with respect to the chuck;
   a guide part disposed on a lateral surface of the chuck; and
   a first guide member provided to an inner surface of the moving plate, the first guide member inserted into the guide part to guide the upper or lower movement of the moving plate relative to the chuck;
   The first guide member includes a first guide component defining an "L" shape and a second guide component defining a mirror image of the first guide component, the first guide component spaced apart from the second guide component; and
   At least a second guide member being a mirror image of the first guide member being provided on opposite inner surface of the moving plate.

2. The apparatus of claim 1, wherein the substrate defines a width, and the chuck defines a width and a height, the width of the substrate is greater than the width of the chuck along an entirety of the height of the chuck.

3. The apparatus of claim 2, wherein the moving plate has a ring shape when viewed from above, and has a stepped shape in which a height of an inner upper surface is lower than a height of an outer upper surface.

4. The apparatus of claim 3, wherein the edge region of the substrate placed on the support unit overlaps the inner upper surface of the moving plate when viewed from above.

5. The apparatus of claim 1, further comprising:
   a control unit,
   wherein the control unit is instructed to move the lifting member in the upper direction and into contact with the substrate.

6. The apparatus of claim 5, wherein the lifting member includes:
   a first lifting member which moves the chuck in the vertical direction; and
   a second lifting member which moves the moving plate in the vertical direction.

7. The apparatus of claim 6, wherein the control unit is instructed to decrease a gap between the substrate and a baffle disposed on an upper portion of the chuck by moving the chuck and the moving plate in the upper direction after the substrate is placed on the chuck, and is instructed to control the first lifting member and the second lifting member so as to move the moving plate in the lower direction in order to remove a membrane attached to the lower surface of the edge region of the substrate and a lateral surface of the substrate caused due to inflow of the plasma to the lower surface of the edge region of the substrate.

* * * * *